US009624884B2

(12) United States Patent
Rodriguez-Amaya et al.

(10) Patent No.: US 9,624,884 B2
(45) Date of Patent: Apr. 18, 2017

(54) METHOD FOR OPERATING A MAGNETIC SWITCHING ELEMENT (75) Inventors: Nestor Rodriguez-Amaya, Stuttgart (DE); Siegfried Ruthardt, Altdorf (DE); Holger Rapp, Ditzingen (DE); Wolfgang Stoecklein, Waiblingen (DE); Bernd Berghaenel, Illingen (DE); Marco Beier, Stuttgart-Feuerbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 184 days.

(21) Appl. No.: 13/883,191

(22) PCT Filed: Oct. 12, 2011

(86) PCT No.: PCT/EP2011/067784
§ 371 (c)(1),
(2), (4) Date: Aug. 1, 2013

(87) PCT Pub. No.: WO2012/059305
PCT Pub. Date: May 10, 2012

(65) Prior Publication Data
US 2013/0300422 A1 Nov. 14, 2013

(30) Foreign Application Priority Data

Nov. 3, 2010 (DE) .................. 10 2010 043 306

(51) Int. Cl.
F02M 51/06 (2006.01)
F02D 41/20 (2006.01)
(Continued)

(52) U.S. Cl.
CPC ............. *F02M 51/06* (2013.01); *F02D 41/20* (2013.01); *F02D 41/247* (2013.01);
(Continued)

(58) Field of Classification Search
CPC . F02D 41/20; F02D 2041/2013; F02M 51/06; F02M 51/061
See application file for complete search history.

(56) References Cited

U.S. PATENT DOCUMENTS 5,740,782 A * 4/1998 Lowi, Jr. .................... 123/446
6,148,800 A * 11/2000 Cari .................... F02D 41/20
123/490
(Continued)

FOREIGN PATENT DOCUMENTS

CN 101326374 12/2008
DE 103 43 211 5/2004
(Continued)

OTHER PUBLICATIONS

International Search Report for PCT/EP2011/067784, dated Dec. 16, 2011.

*Primary Examiner* — Huy Q Phan
*Assistant Examiner* — Adam Clarke
(74) *Attorney, Agent, or Firm* — Gerard Messina (57) ABSTRACT In a method for operating a magnetic switching element, at least one connection of at least one sensor device is connected to at least one connection of a coil of the magnetic switching element, and at least one measuring state is established in which the at least one connection of the coil is largely at least temporarily decoupled from a ground, a voltage source, and/or a current source activating the coil, and at least one auxiliary voltage and/or at least one auxiliary current is/are applied to the at least one connection of the coil in the measuring state, and at least one sensor signal is ascertained from at least one electrical potential, at least one potential difference, and/or at least one current flowing at the connections of the coil.

10 Claims, 10 Drawing Sheets

(51) Int. Cl.
*F02D 41/24* (2006.01)
*G01R 31/327* (2006.01)
*H01F 7/18* (2006.01)

(52) U.S. Cl.
CPC ....... *F02D 41/2438* (2013.01); *G01R 31/327* (2013.01); *F02D 2041/2055* (2013.01); *H01F 2007/185* (2013.01); *H01F 2007/1861* (2013.01)

(56) References Cited

U.S. PATENT DOCUMENTS

| | | | | |
|---|---|---|---|---|
| 6,634,338 | B1* | 10/2003 | Yamakado | F02D 41/20 123/490 |
| 2004/0223282 | A1* | 11/2004 | Bolz | F16K 31/0679 361/139 |
| 2005/0071098 | A1* | 3/2005 | Iannone et al. | 702/65 |
| 2005/0126542 | A1* | 6/2005 | Oono | 123/479 |
| 2006/0065870 | A1* | 3/2006 | Mori et al. | 251/129.07 |
| 2008/0000453 | A1 | 1/2008 | Remele et al. | |
| 2008/0011275 | A1 | 1/2008 | Remele et al. | |
| 2008/0059039 | A1* | 3/2008 | Nakagawa et al. | 701/99 |
| 2008/0257422 | A1* | 10/2008 | Fack | F15B 13/085 137/487.5 |
| 2010/0154903 | A1* | 6/2010 | Schoeneck et al. | 137/551 |
| 2011/0075314 | A1* | 3/2011 | Bauer | F02D 41/20 361/152 |

FOREIGN PATENT DOCUMENTS

| | | |
|---|---|---|
| DE | 10 2006 029 083 | 4/2007 |
| DE | 10 2005 060 414 | 6/2007 |
| DE | 10 2006 029 082 | 1/2008 |
| EP | 1 400 674 | 3/2004 |
| JP | 2004108273 | 4/2004 |
| JP | 2004116523 | 4/2004 |

* cited by examiner

METHOD FOR OPERATING A MAGNETIC SWITCHING ELEMENT

BACKGROUND OF THE INVENTION

1. Field of the Invention

The present invention relates to a method for operating a magnetic switching element, as well as to an electrical circuit and a control and/or regulating device for such a switching element.

2. Description of the Related Art

Magnetic switching elements, such as relays or solenoid valves—the latter, in particular, in the form of fuel injectors of an internal combustion engine—are subject to strict requirements during operation and are therefore frequently monitored. This monitoring may be carried out, for example, by evaluating voltages and/or currents of a coil of the magnetic switching element, or with the aid of sensors which convert physical variables into electrical variables. Additional electric lines are generally required to transmit these variables to a control unit or the like, which results in increased complexity.

BRIEF SUMMARY OF THE INVENTION

The method according to the present invention has the advantage that control lines of the coil of the magnetic switching element, which are provided for the purpose of activating the magnetic switching element, may also be used for the purpose of transmitting the signal of a sensor device in the direction of a driver circuit activating the coil.

The present invention is directed to the finding that a magnetic switching element may, in principle, have an energized and a de-energized state. In the energized state, the behavior of the magnetic switching element is largely determined by the voltage applied to the coil or by the current flowing in the coil, while in the de-energized state, the behavior of the magnetic switching element is determined by the action of a restoring spring. The control lines of the coil therefore have no function during the de-energized state.

In the de-energized state of the coil, according to the present invention, the coil connections are largely temporarily decoupled from the activating voltage source or the activating current source as well as from the ground, and the coil is therefore disconnected. The control lines, which are permanently connected to the coil, are thus available for transmitting signals from the coil in the direction of the activating circuit (driver circuit) in a measuring state.

For example, the coil has two connections and is correspondingly connected to two control lines. In a maximum configuration, up to four sensor devices are connectable to the coil, each of which is connected, for example, as a two-terminal network between one of the connections of the coil and ground. In each case, a pair of two sensor devices is connectable in parallel to each connection of the coil, whereby the sensor devices of one pair being decoupled from each other via counterclockwise switched rectifiers (diodes) and are thus distinguishable depending on a polarity of an auxiliary voltage and/or an auxiliary current which is/are applied to one and/or both connections of the coil in the measuring state.

In addition, the described pairs of sensor devices are distinguishable by measurement in relation to the connections of the coil, with the aid of the ohmic resistance of the coil. Depending on the polarity of the applied auxiliary voltage or the auxiliary current, on the one hand, and taking the ohmic resistance of the coil into account, on the other hand, it is thus possible to distinguish between the up to four sensor devices. In this case, up to four sensor signals may therefore be ascertained by measuring the electrical potentials at the connections of the coil and/or by measuring currents flowing into the connections. The present invention makes use of the fact that the applied auxiliary voltage or the applied auxiliary current has a defined reference to ground. For example, the auxiliary voltage is applied to the connection of the coil via an ohmic resistor, so that a voltage divider is provided against the sensor device(s) connected to ground. In this way, up to four measuring lines and their possible shields may be advantageously eliminated.

If, as described above, auxiliary voltages or auxiliary currents having different polarities are applied to the connections of the coil, at least two measuring states are defined thereby, one of the polarities being used in each of the measuring states.

The present invention furthermore takes into account the fact that the operation of a coil may include not only the actual activation but also additional switching operations, for example an extinction of a residual current flowing through the coil. As a result, not only are corresponding switching elements available in the activating circuit or easily added for the purpose of largely decoupling at least one connection of the coil from the voltage source or current source activating the coil, according to the present invention, but the current flowing through the coil may also quickly subside after the end of the activation with the aid of a rapid extinction system for the purpose of inducing the measuring state.

According to the present invention, it is furthermore possible to disconnect the coil in the measuring state, possibly only at one of the connections. Even in this case, an auxiliary voltage or an auxiliary current may be applied to the disconnected connection, and the method may be carried out, the finite ohmic resistance of the coil being included in the calculation.

As already mentioned above, it is particularly advantageous that the control lines connected to the connections in the measuring state are also used, on the one hand, to apply the auxiliary voltage and/or the auxiliary current to the at least one connection of the coil and, on the other hand, to transmit the at least one electrical potential and/or the at least one current flowing via the connections in the direction of the activating voltage source and/or current source. The control lines of the coil, which supply the driver power during operation, are also used for the at least one measuring state, so that additional measuring lines or the like are not required. As a result, substantial costs are saved and the wiring is simplified.

The method according to the present invention is particularly useful if the magnetic switching element is a servo valve, for example of a fuel injector of an internal combustion engine, or if it belongs thereto, a pressure prevailing in a hydraulic control chamber of the servo valve being ascertained from the sensor signal, and an opening and/or closing point in time of a valve element of the fuel injector, in turn, being ascertained from the pressure. The ascertainment of the opening and/or closing point in time, which is important for the fuel injector, may thus be carried out over the existing control lines of the coil without having to install additional measuring lines and without seals and the like being required.

An important embodiment of the method provides that the magnetic switching element is operated periodically, the switching element being energized in a first phase with the aid of a driver circuit, in that the coil of the magnetic switching element (solenoid valve) is continuously or intermittently connected to the activating voltage source and/or current source, the activating voltage source and/or current source is subsequently disconnected from the coil in a second phase, and a residual current flowing through the coil subsides or is extinguished with the aid of electrical switching elements, and the measuring state is then established in a third phase, and the sensor signal is ascertained. As a result, the method may be applied to periodic operations, in particular to fuel injectors and the short cycles which occur there.

An electrical circuit is furthermore proposed for operating a magnetic switching element according to the described method, the at least one sensor device being connected to at least one connection of the coil, and at least one measuring state may be established in which at least one connection of the coil is largely at least temporarily decoupled from a ground and/or a voltage source and/or current source activating the coil, and at least one auxiliary voltage and/or at least one auxiliary current is applied to at least one connection of the coil in the measuring state, and at least one sensor signal is ascertainable from at least one electrical potential and/or at least one potential difference at the connections of the coil and/or from at least one current flowing via the connections of the coil.

During operation of the electrical circuit, it may be useful to only temporarily apply the at least one auxiliary voltage or the at least one auxiliary current to the connections of the coil in the measuring state, with the aid of mechanical or electronic switches. If the auxiliary voltage or the auxiliary current is applied in two polarities, this may be carried out in chronological succession with the aid of two measuring states, up to two sensor signals being simultaneously ascertainable in each measuring state. However, if only one polarity is used, it is possible to apply the auxiliary voltage or auxiliary current continuously to the connections of the coil. In the latter case, however, it is necessary to dimension those components or component groups which carry the auxiliary voltage or auxiliary current to the coil in such a way that, on the one hand, they are unable to be damaged while the coil is being energized and, on the other hand, they do not negatively affect the energizing.

One embodiment of the electrical circuit provides that the sensor device is an electrical component or an electrical component group. As a result, the sensor device may have a particularly versatile design. For example, one sensor of the sensor device may be a two-pole element, for example a piezoelectric element or a temperature-dependent resistor (PTC/NTC). Additional components may be optionally situated in series or in parallel to this sensor, for example the aforementioned rectifiers (diodes) for using two polarities of the auxiliary voltage or the auxiliary current, as well as series resistors or parallel elements which are able to protect the sensor against overvoltages.

It is furthermore proposed that the auxiliary voltage is derived from an output voltage of a DC/DC converter. As a result, higher auxiliary voltages than would be possible using a vehicle battery may be applied to the coil in the measuring state. This makes it possible to improve the measuring accuracy.

Another embodiment provides that the component or one component of the component group is a force-sensitive transducer. The force-sensitive transducer is designed, for example, to ascertain a pressure prevailing in a hydraulic control chamber of a fuel injector (servo valve). In particular, it may be provided that the force-sensitive transducer is a piezoelectric element.

DETAILED DESCRIPTION OF THE INVENTION

The same reference numerals are used for functionally equivalent elements and variables in all figures, even in different specific embodiments.

Figure 1:
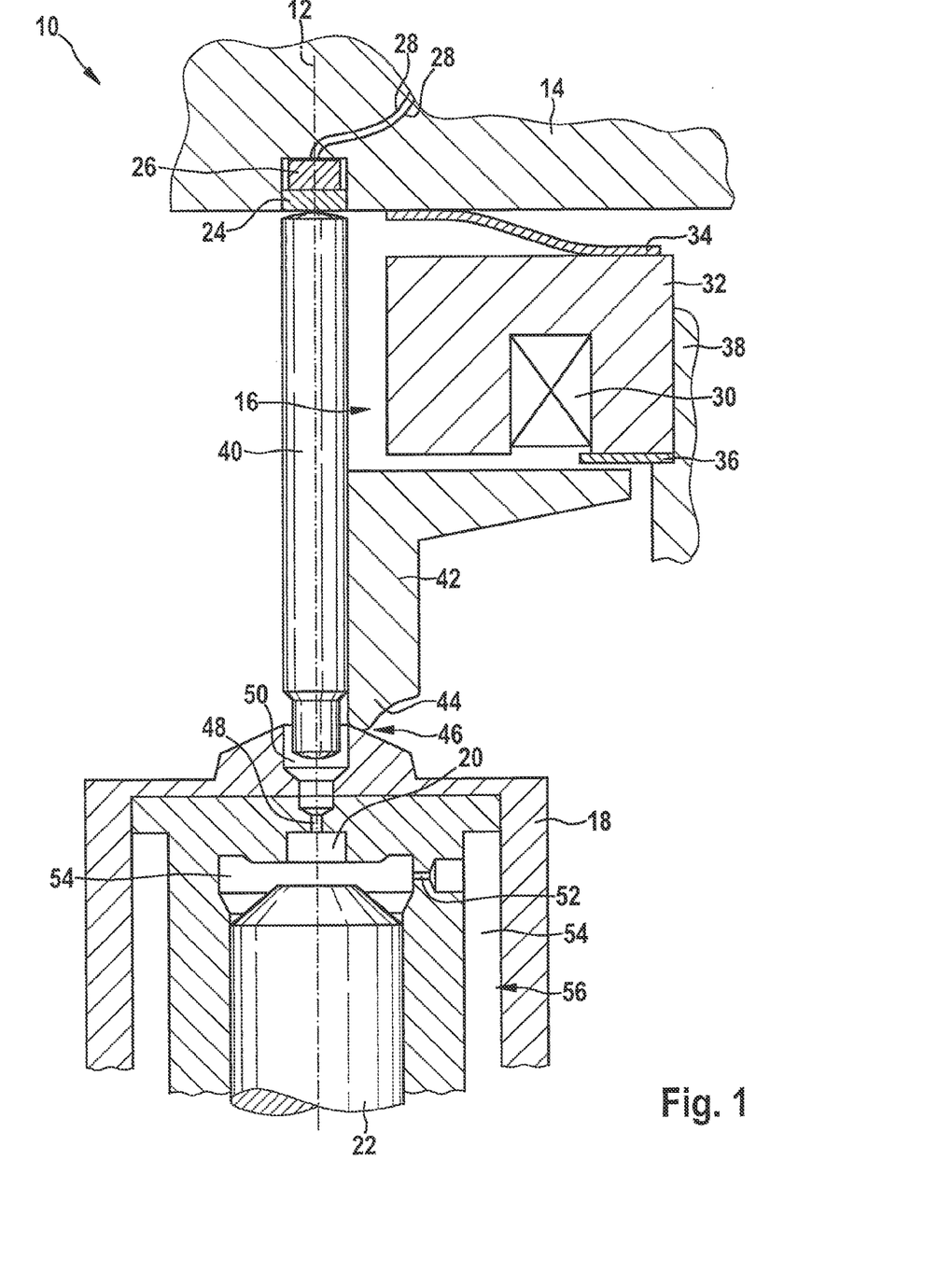
FIG. 1 shows a partial sectional representation of a servo valve of a fuel injector having a magnetic switching element and a valve member.

FIG. 1 shows a partial sectional representation of a servo valve 10 of a fuel injector, which is not illustrated in further detail, of an internal combustion engine. Servo valve 10 is designed to be largely rotationally symmetrical around a longitudinal axis 12. An upper area of the drawing shows a supporting plate 14, which is fixedly anchored to a housing (not illustrated), a middle area shows a magnetic switching element 16, and a lower area shows a valve member 18 fixed in a housing, which has a hydraulic control chamber 20 and a valve piston 22, which acts upon a valve needle (not illustrated) of the fuel injector or which is fixedly connected to a valve needle of this type.

In the area of longitudinal axis 12, supporting plate 14 has a support piston 24, to which a force-sensitive transducer 26 is operatively connected. Force-sensitive transducer 26, in turn, is supported on supporting plate 14 in the direction of longitudinal axis 12. Connecting lines 28 are shown by way of example in the drawing, above force-sensitive transducer 26.

Magnetic switching element 16 includes a coil 30, which is embedded in a magnet core 32, magnet core 32 being pressed against an annular armature stop 36 by a cup spring 34. Armature stop 36, in turn, is pressed by cup spring 34 against a diameter step (no reference numeral) of a sleeve 38 fixed in a housing, with the aid of magnet core 32. Along a middle area of longitudinal axis 12, an armature bolt 40, on which an armature 42 is situated movably in the direction of longitudinal axis 12, is mounted with clearance but held radially in place along longitudinal axis 12. A lower end area 44 of armature 42 shown in FIG. 1 may rest on a sealing section 46 of valve member 18 which forms a valve seat. End area 44 thus forms a valve element of servo valve 10. Like the other elements of servo valve 10, magnetic switching element 16 has a largely rotationally symmetrical design; however, only the right half of a sectional view is shown in the drawing. A guide diameter of armature 42 and a seat diameter in the area of sealing section 46 have approximately the same size.

Valve member 18 delimits hydraulic control chamber 20 and valve piston 22. Valve piston 22 is movable in valve member 18 in the direction of longitudinal axis 12 and, as already mentioned above, it is fixedly coupled with a valve element which is not illustrated (nozzle or valve needle). Above control chamber 20 in the drawing, the control chamber is connected to a pressure chamber 50 via an outlet restrictor 48. An inlet restrictor 52, with the aid of which highly pressurized fluid 54 may be fed into control chamber 20, is situated to the right of control chamber 20 in the drawing. For example, fluid 54 is made available by a common rail fuel system, which is not illustrated. Fluid chamber 56, in which armature 42 and armature bolt 40 are situated, is connected to a high pressure area, which is not illustrated.

As long as coil 30 is not energized, end area 44 is pressed against sealing section 46 by a valve spring, which is not illustrated, and servo valve 10 is thus closed. Due to the pressure conditions in control chamber 20, valve piston 22 in the drawing is pressed downward, so that the valve needle (not illustrated) closes. When coil 30 is energized, armature 42 is moved against armature stop 36 by magnetic force in the direction of magnet core 32. This results in a connection of control chamber 20 at low pressure, which causes the pressure in the control chamber to drop.

At the same time, a high pressure surface, which is not illustrated, on the valve needle, which is also not illustrated, and which is acted upon by valve piston 22, acts in the opening direction. The corresponding force acting in the opening direction is now dominant, so that valve piston 22 moves upward together with the valve needle and thus opens. The fuel injection begins. For closing, the energizing of coil 30 is stopped. End area 44 is again pressed against sealing area 46 by the valve spring, the servo valve therefore closes, and the outflow of fluid from control chamber 20 is stopped. Since fluid continues to flow via inlet restrictor 52 into control chamber 20, valve piston 22 and, along with it the valve needle, are pressed downward in the closing direction in FIG. 1. The fuel injection stops.

The closing point in time of the fuel injector may be ascertained by evaluating the course of the force which armature bolt 40 applies against force-sensitive transducer 26. Due to a force of this type, or due to a change in force, a voltage builds up in the transducer, or a change in resistance and thus a sensor signal are generated. The sensor signal may be ascertained with the aid of electrical circuits, as described below in FIGS. 4 through 11.

Figure 2:
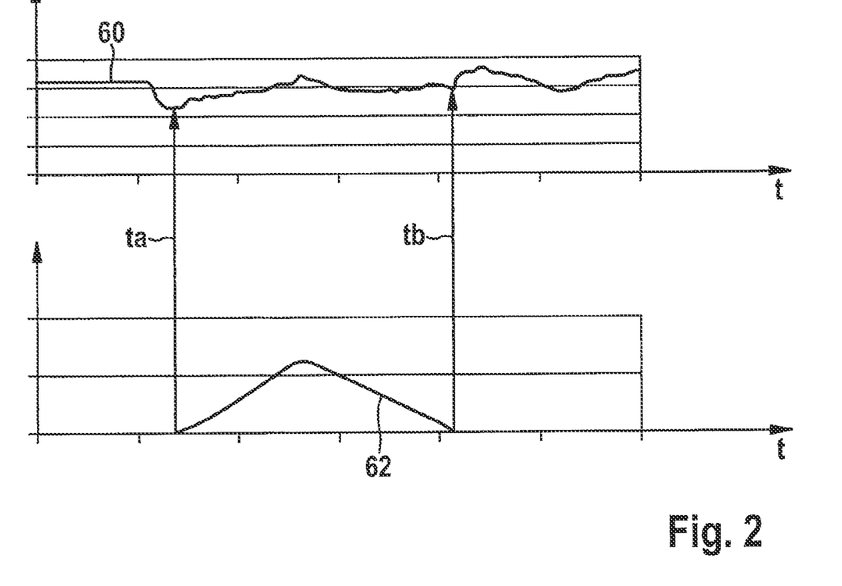
FIG. 2 shows a timing diagram for a control chamber pressure and a lift of a valve element of the servo valve from FIG. 1, designed as a valve needle.

FIG. 2 shows a time correlation between pressure 60 in control chamber 20 and lift 62 of valve piston 22 or the valve needle connected thereto. In FIG. 2, pressure 60 in control chamber 20 is plotted on the ordinate in an upper diagram, and lift 62 of valve piston 22 is plotted on the ordinate in a lower diagram. In the present case, a lift 62 of zero means a closed fuel injector. Both diagrams have an identical time scale t on the abscissa.

It is apparent that the curve of the pressure undergoes clearly visible changes both at the beginning of the opening movement of valve piston 22 at a point in time ta and at the end of the closing movement at a point in time tb. A sudden pressure drop occurs during opening at point in time ta, and a sudden pressure rise occurs during closing at point in time tb. Pressure 60 in control chamber 20 and in pressure chamber 50 acts upon force-sensitive transducer 26 via armature bolt 40, and it may thus be converted into a sensor signal, so that the changes in pressure 60 are mapped in the sensor signal and may thus be evaluated for ascertaining, for example, the closing point in time.

Figure 3:
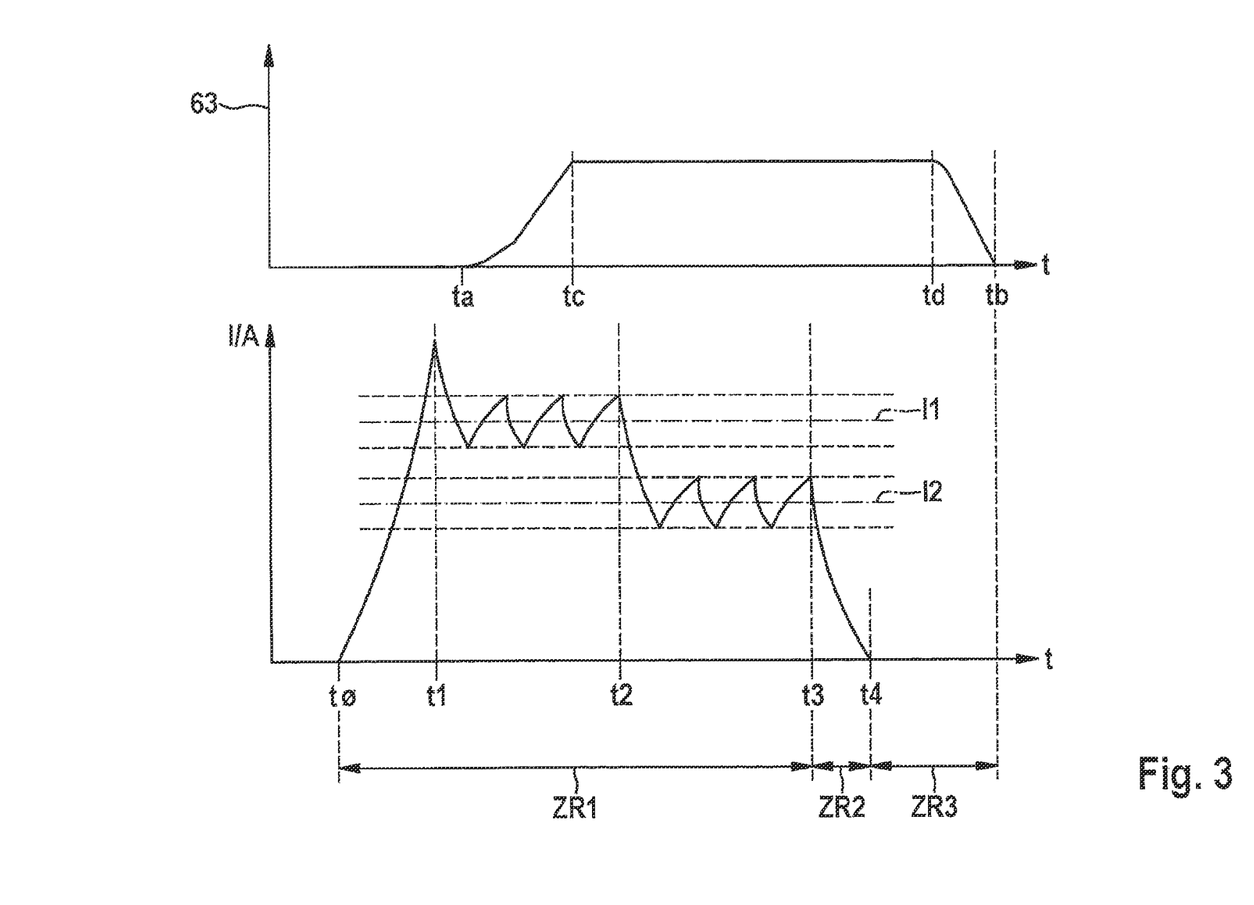
FIG. 3 shows a timing diagram for the lift of the valve needle and a coil current.

FIG. 3 shows a lift 63 of armature 42 of servo valve 10 from FIG. 1 in an upper timing diagram and an associated current I of coil 30 in a lower timing diagram. Both diagrams have an identical time scale t on the abscissa.

Coil 30 of magnetic switching element 16 is energized at a point in time t0, after which current I increases up to a point in time t1. Between point in time t1 and a point in time t2, current I is pulsed in the manner of a two-step controller, an average current I1 being established. Current I is further pulsed between point in time t2 and a point in time t3, an average current I2 being established, which is lower than current I1. Current I is disconnected at point in time t3 and reaches a value of zero at a point in time t4.

End area 44 lifts off of sealing section 46 at point in time ta and strikes armature stop 36 at point in time tc. Due to the absence of magnetic force in coil 30, armature 42 begins to fall away from armature stop 36 at a point in time td and again strikes sealing section 46 at point in time tb.

It is apparent that, at a point in time ZR1 between point in time t1 and point in time t3, the energizing of coil 30 for engaging armature 42 causes the outflow of fuel from control chamber 20, made possible hereby, and subsequently results in the aforementioned opening of the fuel injector. During a period ZR2, the current still flowing in coil 30 subsides with the aid of a rapid extinction. Another period ZR3 then elapses until armature 42 again strikes sealing section 46 at point in time tb, so that the fuel injector closes again shortly thereafter. A measuring state may thus already begin in period ZR3 for the purpose of disconnecting coil 30 and detecting the closing of the fuel injector with the aid of force-sensitive transducer 26 in a time segment (not illustrated) immediately following point in time tb.

Figure 4:
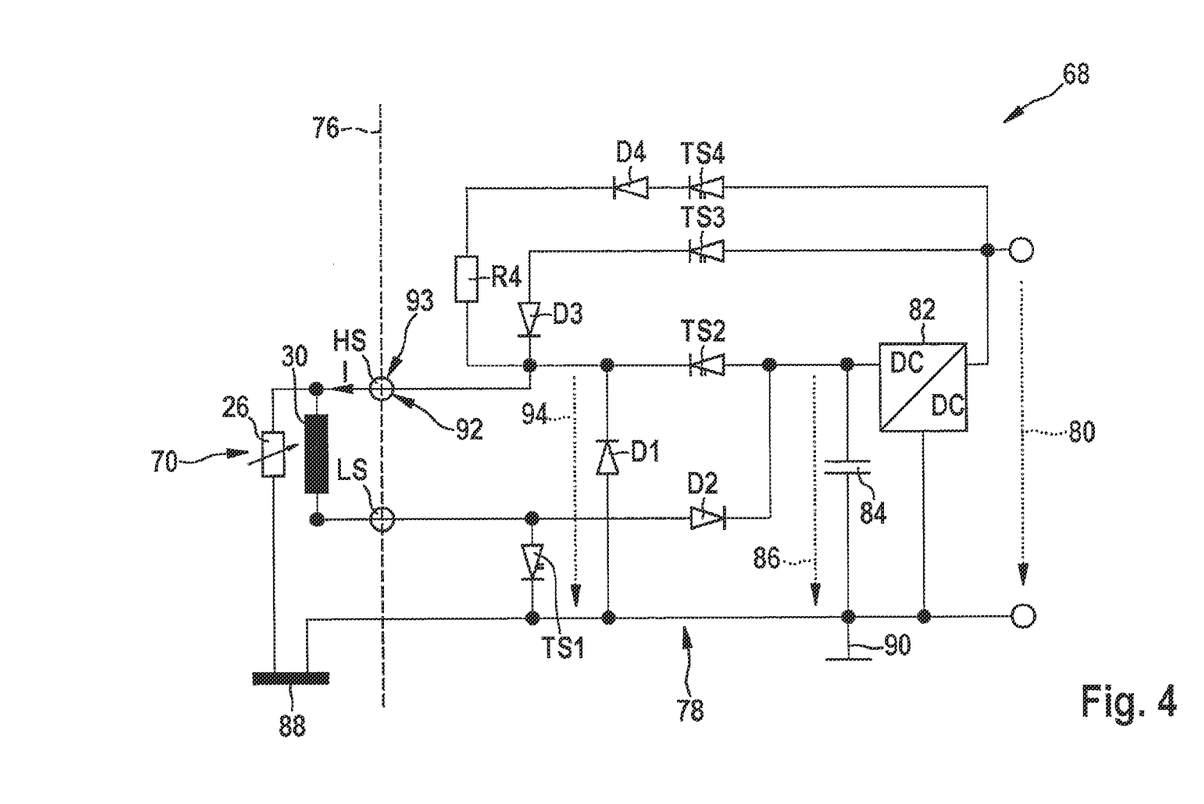
FIG. 4 shows a first specific embodiment of an electrical circuit for operating the servo valve from FIG. 1.

FIG. 4 shows a first specific embodiment of an electrical circuit 68 for activating coil 30 and detecting the signals of force-sensitive transducer 26, which generally also represents a sensor device 70. Coil 30 has an upper connection HS and a lower connection LS. A vertical dashed line represents two control lines 76 (which are not explicitly drawn) between connections HS and LS of coil 30 of magnetic switching element 16 and a driver circuit 78. Driver circuit 78 includes, among other things, a voltage 80 of a vehicle battery, which is not illustrated, a DC/DC converter 82 which is supplied with power therefrom and which builds up a boost voltage 86 at a capacitor 84, as well as diodes D1, D2 and D3, as well as switches TS1, TS2 and TS3.

Diode D1 is connected as a free-wheeling diode. Diodes D1 through D4 as well as switches TS1 through TS4 are designed as semiconductor elements. Capacitor 84 is dimensioned in such a way that boost voltage 86 remains approximately constant in all phases of operation and, in the present case, is, as an example, around 48 volts. An area shown to the left of the vertical dashed line (control lines 76) in the drawing of FIG. 4 describes electrical components of magnetic switching element 16 of the fuel injector, and an area shown to the right of plane 76 describes electrical components of a control and/or regulating device (control unit) of an internal combustion engine in which the fuel injector is used.

In a first phase starting at point in time t0 (FIG. 3), coil 30 is energized with the aid of driver circuit 78. For this purpose, switch TS1 connects connection LS of coil 30 to a ground 88 (vehicle ground). Switch TS2 is also conductive, so that a current rise corresponding to boost voltage 86 occurs in coil 30. Switches TS3 and TS4 are blocked. At point in time t1 in FIG. 3, switch TS2 is blocked, and a pulsed energizing of coil 30 is carried out with the aid of switch TS3 in a similar manner as shown between points in time t1 and t3 in FIG. 3.

In a second phase starting at point in time t3, switches TS1 and TS3 are blocked. A rapid extinction of current I subsequently occurs as follows: Current I flows primarily via connection LS of coil 30, then via diode D2, then via capacitor 84 to a ground 90, which has approximately the same potential as ground 88; it then flows via diode D1 and then into connection HS of coil 30. Because capacitor 84 has a comparatively high voltage (for example, approximately 48 volts in the present case), the electrical power is comparatively high and the time constant for reducing current I is correspondingly low.

In a third phase starting at point in time t4, a measuring state is established for the purpose of transmitting or ascertaining a sensor signal generated by force-sensitive transducer 26. In this phase, switches TS1 through TS3 are blocked and switch TS4 is conductive. A potential 92 is thus provided at connection HS of coil 30 from a voltage divider, which largely includes a resistor R4 as well as force-sensitive transducer 26 or its electrically active component. The voltage drops occurring at diode D4 and switch TS4 are taken into account during an evaluation of potential 92. Potential 92 also characterizes an auxiliary voltage 94, which is provided or supplied from voltage 80 via resistor R4. Since potential 92 is transmitted to the control unit of the internal combustion engine via control lines 76 of coil 30, the control signal of force-sensitive transducer 26 may be ascertained therefrom. However, the electrical components needed for this purpose are not illustrated in the drawing of FIG. 4. The force acting upon force-sensitive transducer 26 and pressure 60 prevailing in control chamber 20 may be determined from the ascertained sensor signal. Diodes D3 and/or D4 may be omitted if switches TS3 and TS4 provided in series have a corresponding blocking action.

The alternative specific embodiments of electrical circuits 68 illustrated in the following FIGS. 5 through 10 operate, in principle, in a manner similar to the specific embodiment of electrical circuit 68 shown in FIG. 4. As a result, the particular differences are generally described below.

Figure 5:
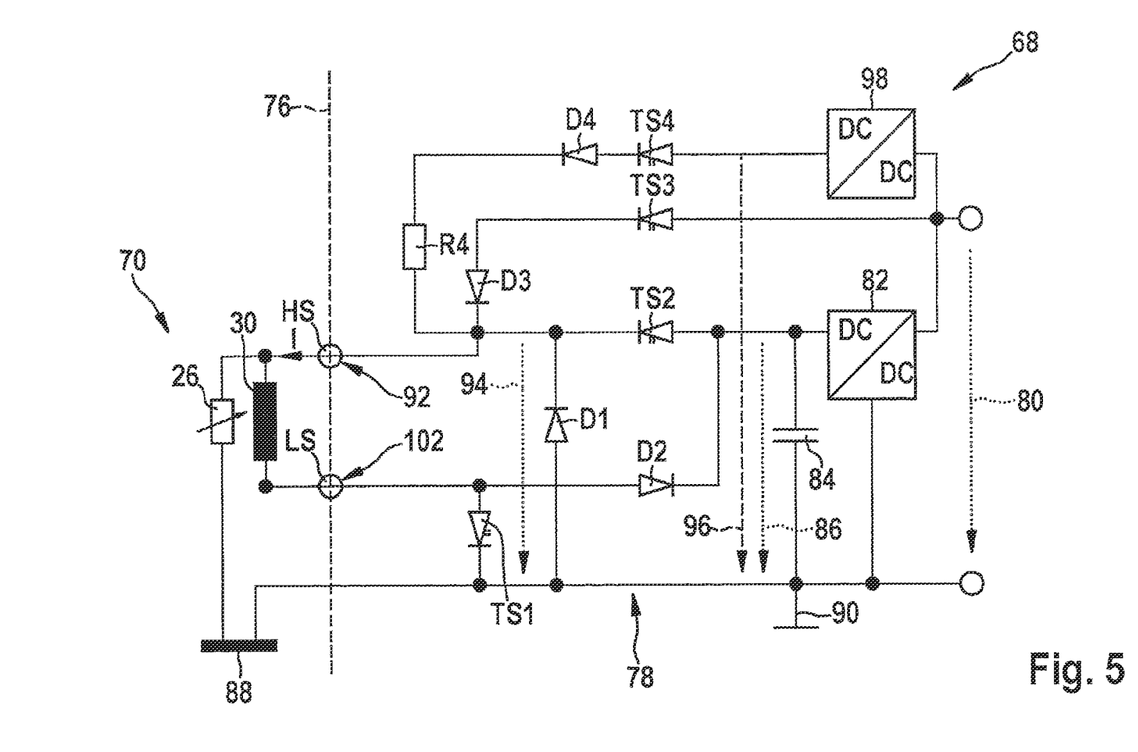
FIG. 5 shows a second specific embodiment of the electrical circuit.

In contrast to FIG. 4, auxiliary voltage 94 in the specific embodiment from FIG. 5 is generated from a voltage 96 of a second DC/DC converter 98 via resistor R4. In the present case, voltage 96 is higher than voltage 80, the area of application of electrical circuit 68 being expanded, if necessary, or the resolution of potential 92 being improved.

Figure 6:
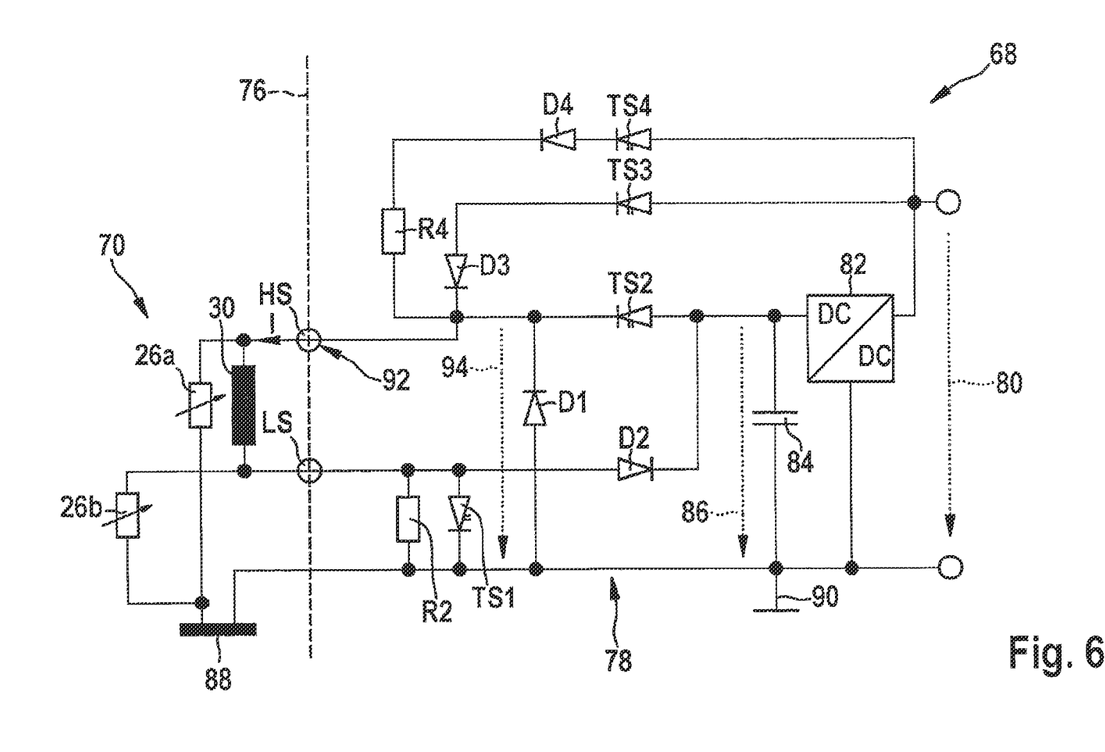
FIG. 6 shows a third specific embodiment of the electrical circuit.

In the specific embodiment of FIG. 6, in contrast to FIG. 4, a second sensor device 26b, which is, for example, a temperature sensor, is connected to connection LS of coil 30. The force-sensitive transducer is identified by reference numeral 26a in FIG. 6. A resistor R2 is connected in parallel to switch TS1. If necessary, resister R2 may prevent a voltage shift caused by diode D2, and it is comparatively high ohmic in relation to the remaining resistors connected to coil 30. If resistor R2 is given a low ohmic design for functional reasons, a diode (not illustrated) may be series-connected to resistor R2.

The first two phases, i.e., the energizing of coil 30 and the subsequent rapid extinction, correspond to those in FIG. 4. The measuring state established in the third phase, however, enables two signals to be ascertained simultaneously in FIG. 6, namely the signal of force-sensitive transducer 26a and that of temperature sensor 26b.

The voltage divider provided in the measuring state is largely formed from resistor R4 and a network connected thereto. This network includes components 26a and 26b as well as coil 30 and resistor R2. Due to the ohmic resistance of coil 30, different potentials 94 and 102 may be correspondingly tapped at connections HS and LS. Taking the network and values of resistors R4 and R2 into account, as well as the resistance of coil 30, the sensor signals may be ascertained and the physical variables on which they are based determined.

Figure 7:
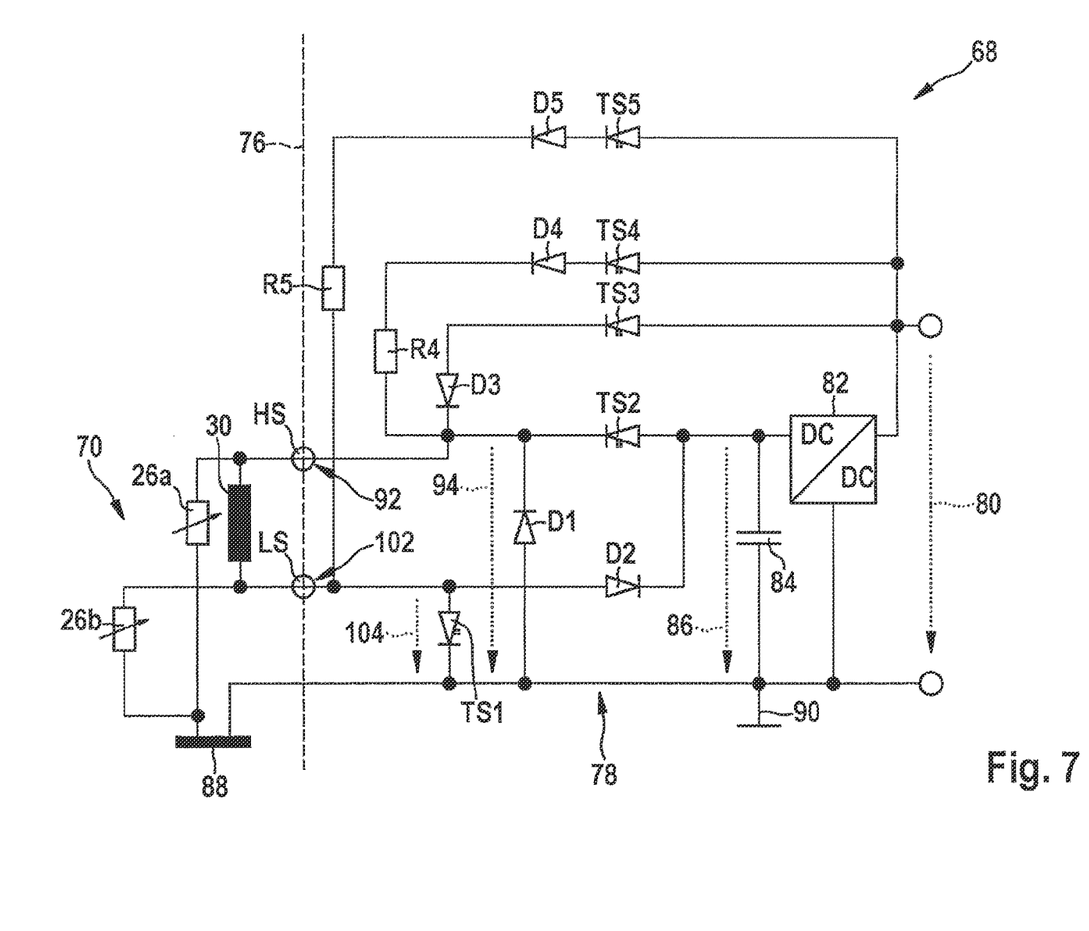
FIG. 7 shows a fourth specific embodiment of the electrical circuit

FIG. 7 shows a fourth electrical circuit 68, similar to the one in FIG. 6. In contrast to the circuit in FIG. 6, a second auxiliary voltage 104 may be applied to connection LS of coil 30 with the aid of a resistor R5, a diode D5 and a switch TS5. Although this makes the network surrounding coil 30 slightly more complicated in the measuring state, potentials 92 and 102 may also be ascertained, and the sensor signals and physical variables on which they are based may be similarly determined. It may be advantageous to not allow switches TS4 and TS5 to be simultaneously conductive, but rather to be conductive consecutively or alternately, the switching points in time being adapted, if necessary, to expected changes in the sensor signal. In this way, the influence of the ohmic resistance of coil 30 may be more effectively taken into account, so that a more accurate ascertainment of the sensor signals is facilitated.

Figure 8:
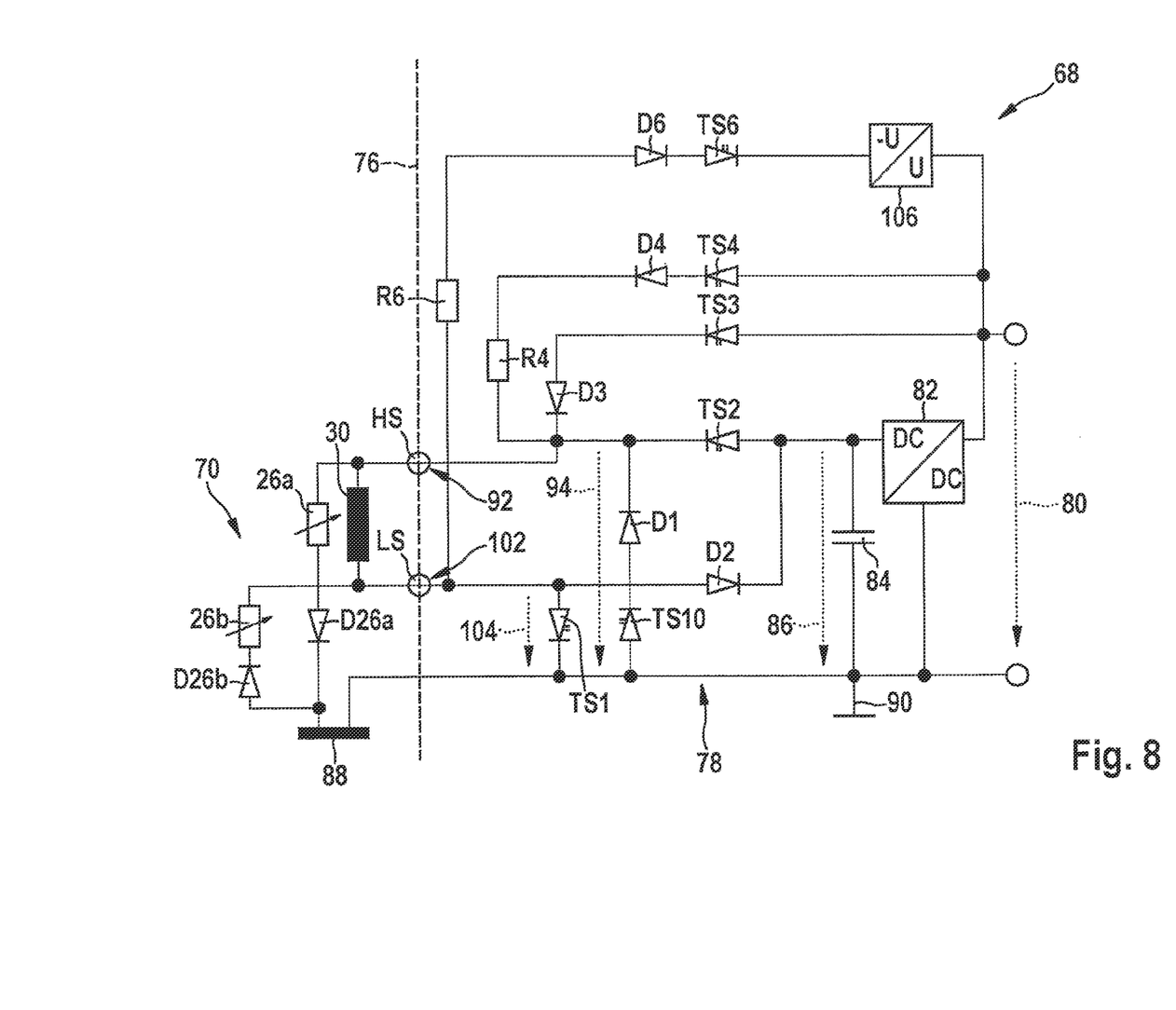
FIG. 8 shows a fifth specific embodiment of the electrical circuit.

FIG. 8 shows a fifth electrical circuit 68, similar to the one in FIG. 7. In contrast to FIG. 7, series-connected diodes D26a and D26b are added to components 26a and 26b to form component groups. Diodes D26a and D26b are connected in a counterclockwise direction in relation to ground 88. A DC/DC converter 106 is supplied with power from voltage 80 and generates a negative DC voltage to ground 88 which may be applied to connection LS via a series connection including a resistor R6, a diode D6 and a switch TS6. As already shown in FIG. 7, voltage 80 may be applied to connection HS via the series connection which includes resistor R4, diode D4 and switch TS4.

In the third phase of operating magnetic switching element 16 or the fuel injector, a first measuring state is established in which switch TS4 is conductive. The other switches TS1, TS2, TS3, TS6 and TS10 are blocking. A positive auxiliary voltage 94 to ground 88 is produced at connection HS, and diode D72 therefore becomes conductive, and component 26a, together with resistor R4, thus largely determines auxiliary voltage 94 and potential 92. The sensor signal determined by component 26a may now be ascertained from potential 92.

In a subsequent, second measuring state, switch TS4 is blocked and switch TS6 is conductive. A negative auxiliary voltage 104 to ground 88 is produced at connection LS, and diode D26b therefore becomes conductive, and component 26b, together with resistor R6, thus largely determines auxiliary voltage 104 and potential 102. The sensor signal determined by component 26b may now be ascertained from potential 102. It is important for switch TS10 to be blocked to prevent a short circuit of negative auxiliary voltage 104 via diode D1.

The advantage of the electrical circuit in FIG. 8, in contrast to FIG. 7, is that the resistance of coil 30 is not important for ascertaining the sensor signals. As a result, the accuracy of the ascertainment may be substantially improved, in particular if coil 30 has only one low ohmic resistor.

Figure 9:
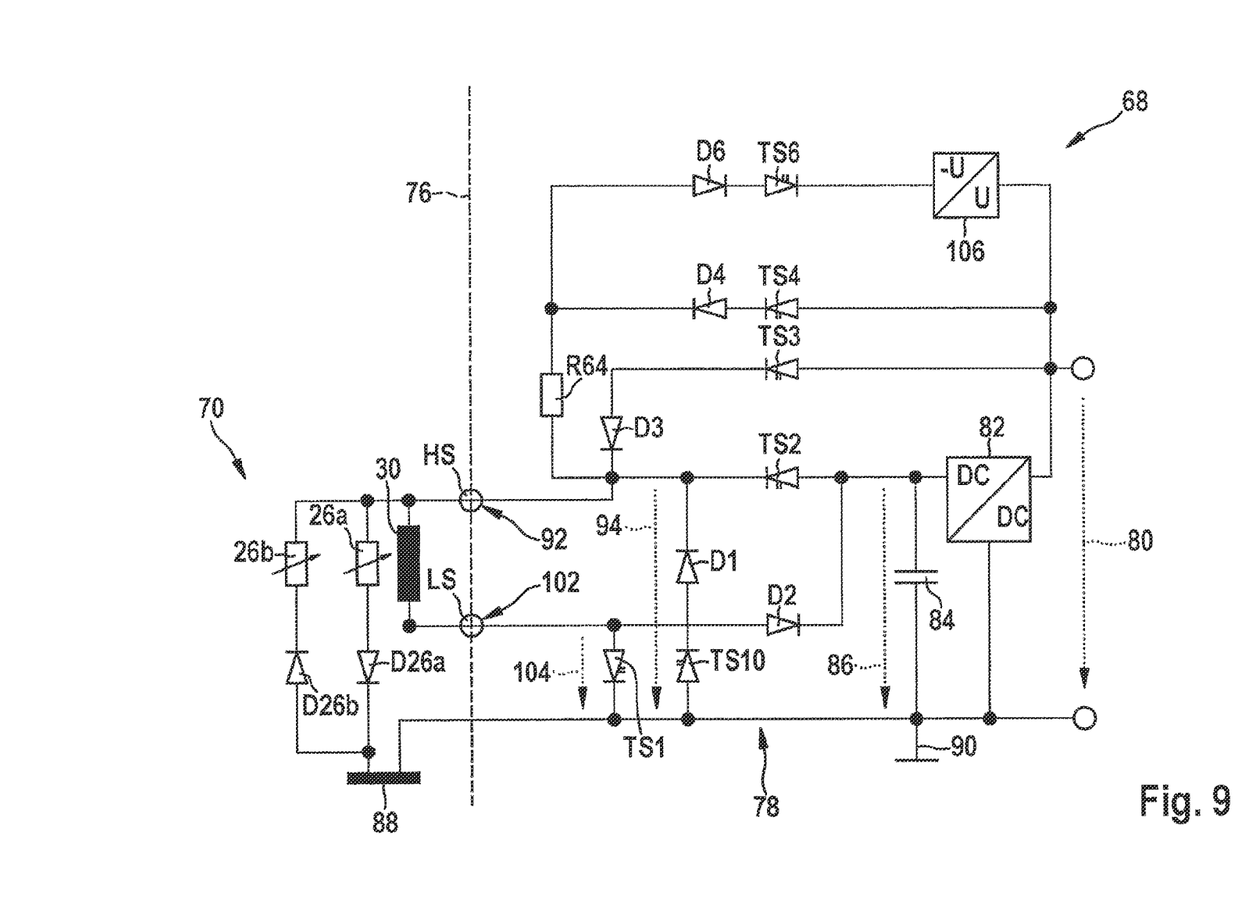
FIG. 9 shows a sixth specific embodiment of the electrical circuit.

FIG. 9 shows a specific embodiment of electrical circuit 68 which is similar to FIG. 8. In contrast to FIG. 8, the component groups including component 26a and diode D26a as well as component 26b and diode D26b are connected only to connection HS of coil 30. Likewise, component groups R4, D4, TS4 and R6, D6, TS6 are combined for applying the auxiliary voltages via a shared resistor R64 and lead to connection HS.

Figure 10:
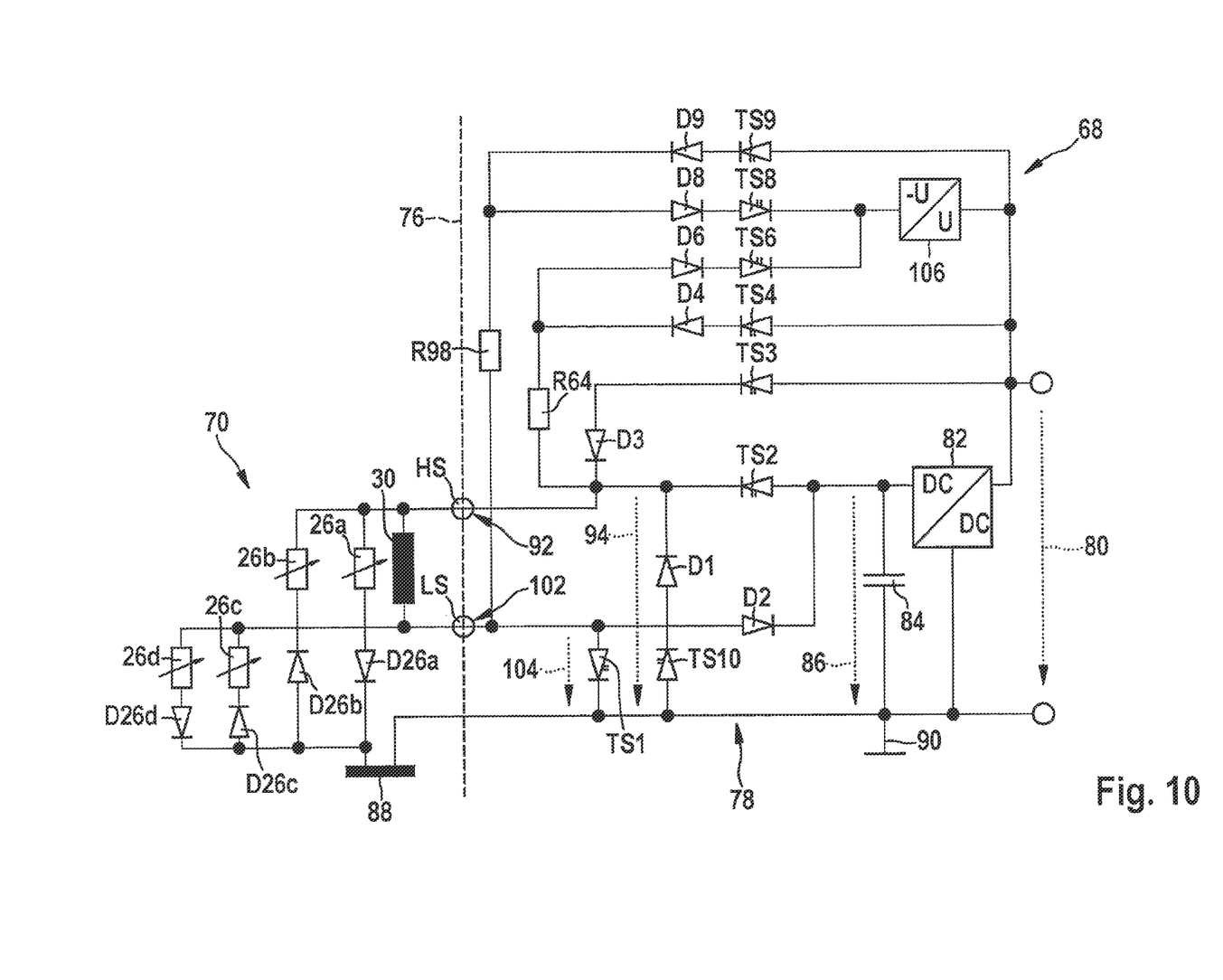
FIG. 10 shows a seventh specific embodiment of the electrical circuit.

FIG. 10 shows an expansion of electrical circuit 68 including a total of four sensor devices 26a through 26d, each of which is series-connected to diodes D26a through D26d. The series connections are connected in pairs to connections HS and LS and to ground 88. Sensor devices 26 of each pair are decoupled from each other via counterclockwise connected diodes D26a and D26b and D26c and D26d, respectively.

In the third phase of operation, a first measuring state is established in which switch TS4 is conductive while the other switches TS1, TS2, TS3, TS6, TS8, TS9 and TS10 are blocking.

As a result, diodes D26a and D26d are conductive, so that the resistance of components 26a and 26d may be determined from potentials 92 and 102 and with knowledge of the resistance of coil 30.

A second measuring state is subsequently established in which switch TS6 is conductive while the other switches TS1, TS2, TS3, TS4, TS8, TS9 and TS10 are blocking. As a result, diodes D26b and D26c are conductive, so that the resistance of components 26b and 26c may be determined from potentials 92 and 102 and with knowledge of the resistance of coil 30.

Alternatively or additionally, switch TS9 may be conductive instead of switch TS4 in the first measuring state, and switch TS8 may be conductive instead of switch TS6 in the second measuring state. By using both alternatives, it may be possible, if necessary, to ascertain the resistance of coil 30. It should be noted that electrical circuit 68 may ascertain the sensor signals or the values of components 26a through 26d, according to the present invention, even without the branches having switches TS8 and TS9, in particular if the resistance of coil 30 is known.

Figure 11:
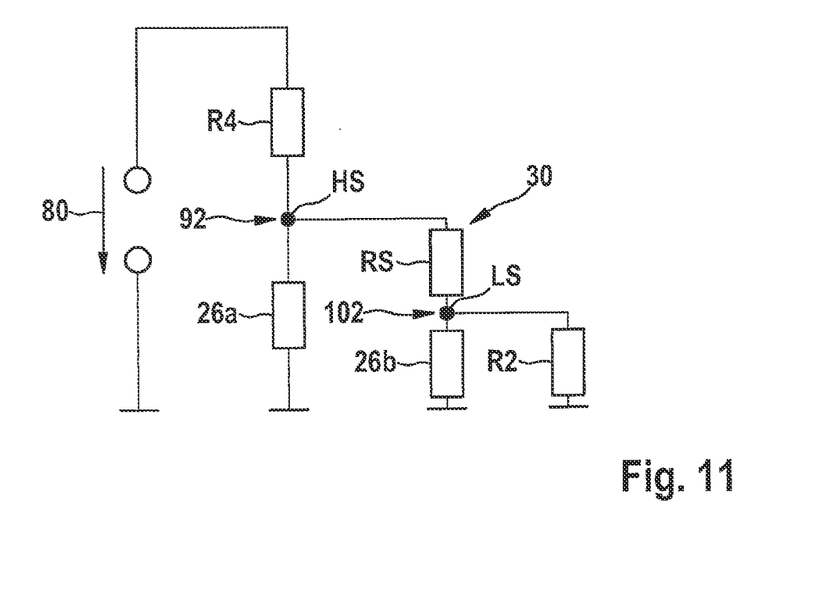
FIG. 11 shows an equivalent circuit diagram for ascertaining sensor signals in the electrical circuit according to FIG. 6.

FIG. 11 shows an equivalent circuit diagram which matches FIG. 6, the resistances of components 26a and 26b being ascertained if the resistances of resistors R2 and R4 as well as the resistance of coil resistor RS are known (ignoring the voltage drops at the diodes and the switches). The algorithms to be used for this purpose are generally known.

What is claimed is:

1. A method for operating a magnetic switching element, comprising:
   connecting a coil of the magnetic switching element to a control device at first connection points;
   connecting at least one sensor to each of at least one of the first connection points; and
   in a measuring state:
      decoupling, by the control device, the first connection points from a voltage source voltage that activates the coil;
      applying, by the control device, at least one of an auxiliary voltage and an auxiliary current to the first connection points, wherein an electrical potential at the at least one of the first connection points is affected by (a) the at least one of the auxiliary voltage and auxiliary current applied by the control device and (b) a signal output by the at least one sensor; and
      ascertaining the signal output by the at least one sensor by measuring at least one of (i) the electrical potential at the at least one of the first connection points, (ii) a potential difference involving the electrical potential at the at least one of the first connection points, and (iii) a current flowing through the at least one of the first connection points.

2. The method as recited in claim 1, wherein at least one control line connected to the first connection points in the at least one measuring state is used to (i) apply the at least one of the auxiliary voltage and the auxiliary current to the first connection points, and (ii) transmit the at least one of the electrical potential at the at least one of the first connection points and the current flowing through the at least one of the first connection points in a direction of the voltage source.

3. The method as recited in claim 1, wherein:
   the magnetic switching element is a servo valve of a fuel injector of an internal combustion engine or a component of the servo valve;
   the sensor signal is formed in response to a pressure prevailing in a hydraulic control chamber; and
   at least one of an opening and closing point in time of a valve element of the fuel injector is ascertained from the ascertained pressure prevailing in the hydraulic control chamber.

4. The method as recited in claim 1, wherein the magnetic switching element is operated periodically in the following manner:
   in a first phase, the magnetic switching element is energized with the aid of a driver circuit of the control device such that the coil of the magnetic switching element is at least intermittently connected to the voltage source voltage that activates the coil;
   in a subsequent second phase, the voltage source voltage that activates the coil is subsequently disconnected from the coil of the magnetic switching element, and a residual current flowing through the coil is substantially extinguished with the aid of electrical switching elements; and
   in a subsequent third phase, the measuring state is established and the sensor signal is ascertained.

5. An electrical circuit for operating a magnetic switching element, comprising:
   for each of at least one of first connection points, at least one sensor connected the respective connection point;
   a control device that is connected to a coil of the magnetic switching element at the first connection points and that is configured to, in a measuring state:
      decouple the first connection points from a voltage source voltage that activates the coil; and
      apply at least one of an auxiliary voltage and an auxiliary current to the first connection points, wherein an electrical potential at the at least one of the first connection points is affected by (a) the at least one of the auxiliary voltage and auxiliary current applied by the control device and (b) a signal output by the at least one sensor; and
   a measurement circuit that is configured to, in the measuring state, ascertain the signal output by the at least one sensor by measuring at least one of (i) the electrical potential at the at least one of the first connection points, (ii) a potential difference involving the electrical potential at the at least one of the first connection points, and (iii) a current flowing through the at least one of the first connection points.

6. The electrical circuit as recited in claim 5, wherein the auxiliary voltage is derived from an output voltage of a DC/DC converter.

7. The electrical circuit as recited in claim 5, wherein the at least one sensor includes an electrical component or an electrical component group.

8. The electrical circuit as recited in claim 7, wherein the at least one sensor includes a force-sensitive transducer.

9. The electrical circuit as recited in claim 8, wherein the force-sensitive transducer is a piezoelectric element.

10. A device, comprising:
   a processor; and
   a non-transitory computer-readable data storage medium storing a computer program having program codes that are executable by the processor and that, when executed by the processor, cause the processor to perform a method for operating a magnetic switching element, the method comprising:
      connecting a coil of the magnetic switching element to a control device at first connection points;
      connecting at least one sensor to each of at least one of the first connection points; and
      in a measuring state:
         decoupling, by the control device, the first connection points from a voltage source voltage that activates the coil;
         applying, by the control device, at least one of an auxiliary voltage and an auxiliary current to the first connection points, wherein an electrical potential at the at least one of the first connection points is affected by (a) the at least one of the auxiliary voltage and auxiliary current applied by the control device and (b) a signal output by the at least one sensor; and
         ascertaining the signal output by the at least one sensor by measuring at least one of (i) the electrical potential at the at least one of the first connection points, (ii) a potential difference involving the electrical potential at the at least one of the first connection points, and (iii) a current flowing through the at least one of the first connection points.

\* \* \* \* \*